(12) United States Patent
Samad

(10) Patent No.: US 7,711,328 B1
(45) Date of Patent: May 4, 2010

(54) METHOD OF AND CIRCUIT FOR SAMPLING A FREQUENCY DIFFERENCE IN AN INTEGRATED CIRCUIT

(75) Inventor: Maheen A. Samad, Mountain View, CA (US)

(73) Assignee: XILINX, Inc., San Jose, CA (US)

( * ) Notice: Subject to any disclaimer, the term of this patent is extended or adjusted under 35 U.S.C. 154(b) by 888 days.

(21) Appl. No.: 11/360,321

(22) Filed: Feb. 22, 2006

Related U.S. Application Data

(63) Continuation-in-part of application No. 11/170,020, filed on Jun. 29, 2005, now Pat. No. 7,635,997.

(51) Int. Cl.
*H04B 1/40* (2006.01)

(52) U.S. Cl. .......................... 455/76; 455/260; 375/376

(58) Field of Classification Search ................ 455/76, 455/260; 375/376
See application file for complete search history.

(56) References Cited

U.S. PATENT DOCUMENTS

| | | | | |
|---|---|---|---|---|
| 4,019,153 | A | * | 4/1977 | Cox et al. .................. 331/1 A |
| 4,535,461 | A | * | 8/1985 | Stepp et al. ................. 375/375 |
| 5,063,577 | A | * | 11/1991 | Arbanas et al. ............. 375/376 |
| 5,510,740 | A | | 4/1996 | Farrell et al. |
| 5,555,025 | A | * | 9/1996 | McArthur .................. 348/478 |
| 6,272,190 | B1 | | 8/2001 | Campana, Jr. |
| 6,351,485 | B1 | | 2/2002 | Soe et al. |
| 6,356,122 | B2 | | 3/2002 | Sevalia et al. |
| 6,384,647 | B1 | | 5/2002 | Logue |
| 6,522,207 | B1 | | 2/2003 | Boerstler et al. |
| 6,560,164 | B2 | | 5/2003 | Kawai et al. |
| 6,621,762 | B1 | | 9/2003 | Roohparvar |
| 6,756,822 | B1 | | 6/2004 | Kaviani |
| 6,838,918 | B1 | * | 1/2005 | Kaviani ...................... 327/160 |
| 6,847,240 | B1 | * | 1/2005 | Zhou .......................... 327/143 |
| 6,870,429 | B2 | | 3/2005 | Hawley et al. |
| 6,873,483 | B2 | | 3/2005 | Hetzler et al. |
| 6,901,039 | B1 | | 5/2005 | Sugie et al. |
| 6,903,615 | B2 | | 6/2005 | Landman et al. |
| 6,993,307 | B2 | * | 1/2006 | Welland et al. ............. 455/260 |
| 7,081,780 | B2 | | 7/2006 | Briggs et al. |
| 7,103,127 | B2 | | 9/2006 | Damgaard et al. |
| 7,190,196 | B1 | * | 3/2007 | Kaviani ...................... 327/141 |
| 7,242,229 | B1 | | 7/2007 | Starr et al. |
| 7,242,740 | B2 | | 7/2007 | Spijker et al. |

(Continued)

OTHER PUBLICATIONS

U.S. Appl. No. 11/015,674, filed Dec. 17, 2004, Kaviani.

(Continued)

*Primary Examiner*—Matthew D Anderson
*Assistant Examiner*—Erica Fleming-Hall
(74) *Attorney, Agent, or Firm*—John J. King

(57) ABSTRACT

A method of sampling a frequency difference in an integrated circuit is disclosed. The method comprises the steps of receiving a clock signal in a first clock domain; comparing a count of the clock signal in the first clock domain to a predetermined value N; converting the result of the comparison to a second clock domain; and generating an error signal representing the difference between the count of the first clock signal and the count of a second clock signal in the second clock domain. A circuit for sampling a frequency difference in an integrated circuit is also disclosed.

16 Claims, 7 Drawing Sheets

306

U.S. PATENT DOCUMENTS

| | | |
|---|---|---|
| 7,394,322 B2 | 7/2008 | Beeson |
| 7,432,751 B2 | 10/2008 | Fang |
| 7,576,622 B1 | 8/2009 | Samad |
| 2004/0075506 A1* | 4/2004 | Welland et al. .............. 331/74 |
| 2004/0150438 A1* | 8/2004 | Jung et al. ................. 327/119 |
| 2005/0035793 A1 | 2/2005 | Shiung |
| 2005/0186930 A1* | 8/2005 | Rofougaran et al. ........ 455/260 |
| 2005/0250464 A1* | 11/2005 | Spencer et al. .............. 455/260 |
| 2006/0063502 A1* | 3/2006 | Shibuya et al. .............. 455/255 |
| 2006/0211381 A1* | 9/2006 | Jensen .......................... 455/76 |
| 2006/0220752 A1* | 10/2006 | Fukusen ...................... 331/17 |
| 2007/0060090 A1* | 3/2007 | Wagner ...................... 455/260 |
| 2008/0157823 A1 | 7/2008 | Yu et al. |
| 2008/0187038 A1 | 8/2008 | Currivan et al. |
| 2008/0192863 A1 | 8/2008 | Mehmia et al. |
| 2008/0226004 A1 | 9/2008 | Oh |
| 2008/0284919 A1* | 11/2008 | Vorenkamp et al. ......... 348/735 |

OTHER PUBLICATIONS

U.S. Appl. No. 11/169,461, filed Jun. 29, 2005, Samad et al.

U.S. Appl. No. 11/169,818, filed Jun. 29, 2005, Kaviani et al.

Kaviani, Alireza S., "Phase Alignment Using Asynchronous State Machines", Apr. 19-23, 2004, 86-94 pages, 10th International Symposium on Axynchronous Circuits and Systems (ASYNC'04), ISSN:1522-8681/04, 2004 IEEE.

U.S. Appl. No. 11/360,327, filed Feb. 22, 2006, Samad, Maheen A., entitled, "A Method of Generating an Output of a Frequency Synthesizer", 32 pgs. available from Xilinx, Inc. 2100 Logic Dr., SJ, CA 95124.

U.S. Appl. No. 11/170,020, filed Jun. 29, 2005, Samad, Maheen A., entitled, "A Circuit for and Method of Changing a Frequency in a Circuit", 30 pgs. available from Xilinx, Inc. 2100 Logic Dr., SJ, CA 95124.

* cited by examiner

Table 1

| Frequency Detector Error Signal | Update Magnitude1 | Update Rate 1 | Update Magnitude 2 | Update Rate 2 |
|---|---|---|---|---|
| +5 | 3x | 2 | 3 | 2 |
| +4 | 3x | 2 | 3 | 2 |
| +3 | 1x | 1 | 2 | 1 |
| +2 | 1x | 1 | 2 | 1 |
| +1 | ½ x | 1 | 1 | 1 |
| 0 | ½ x | 0 | 0 | 0 |
| -1 | ½ x | 1 | 1 | 1 |
| -2 | 1x | 1 | 2 | 1 |
| -3 | 1x | 1 | 2 | 1 |
| -4 | 3x | 2 | 3 | 2 |
| -5 | 3x | 2 | 3 | 2 |

Table 2

| Frequency Detector Error Signal | Update Magnitude1 | Update Rate 1 | Update Magnitude 2 | Update Rate 2 |
|---|---|---|---|---|
| +3 | 0 | 0 | 1 | 1/2 x |
| +2 | 0 | 0 | 1 | 1/2 x |
| +1 | 0 | 0 | 1 | 1/3 x |
| 0 | 0 | 0 | 1 | 1/3 x |
| -1 | 0 | 0 | 1 | 1/3 x |
| -2 | 0 | 0 | 1 | 1/2 x |
| -3 | 0 | 0 | 1 | 1/2 x |

METHOD OF AND CIRCUIT FOR SAMPLING A FREQUENCY DIFFERENCE IN AN INTEGRATED CIRCUIT

FIELD OF THE INVENTION

The present invention relates generally to frequency synthesizers, and in particular, to a method of and circuit for sampling a frequency difference in an integrated circuit.

BACKGROUND OF THE INVENTION

A programmable logic device, such as a field programmable gate array (FPGA), is designed to be user-programmable so that users can implement logic designs of their choices. In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. As circuit designs implemented in an FPGA are becoming more complex, the number of CLBs, IOBs, and other resources such as multipliers and block RAMs has increased, as well as the generalized routing resources to make the connections between the various blocks.

Clock signals are also used for a variety of purposes in digital circuits, both on board level systems and integrated circuit (IC) devices. An integrated circuit such as a programmable logic device (PLD) typically receives one or more external reference clock signals to generate one or more internal clock signals to operate internal digital circuits. In synchronous systems, global clock signals are used to synchronize various circuits across the board or IC device. For example, internal circuits could be clocked by a first clock signal at a first clock frequency, while input/output (I/O) circuits could be clocked by a second clock signal at a second clock frequency. As the complexity of digital systems increases, clocking schemes continue to become more complicated, and there is a greater need for additional clock signals and more flexibility in generating various clock signals.

While multiple clock generating circuits could be used to generate the multiple clock signals, clock generating circuits typically consume a large amount of chip space. Therefore, most systems use one clock generating circuit to generate a first clock signal called a reference clock signal, and a specialized circuit to derive other clock signals from the reference clock signal. For example, clock dividers are used to generate one or more clock signals of lower clock frequencies from the reference clock signal. Typically, clock dividers divide the frequency of the reference clock signal by an integer value D. Conversely, clock multipliers are used to generate one or more clock signals of higher clock frequencies (e.g. M times the reference clock signal). Combining clock multipliers with clock dividers provides clock circuits which can generate one or more clock signals having frequencies that are fractional values of the frequency of the reference clock signal, commonly called frequency synthesis. For example, if the generated clock frequency has a ratio of M/D that is 7/5 of the reference clock frequency, then the two clock edges should be in concurrence every 7 cycles of the generated clock signal and every 5 cycles of the reference clock signal.

These internal clock signals must be carefully controlled to ensure proper timing in the integrated circuit. Clock management circuits are used in integrated circuits to perform various functions including frequency synthesis. Traditionally, frequency synthesis is done using Phase-Locked Loops (PLLs). A PLL uses a voltage controlled oscillator, which generates a clock signal that approximates the input clock. The control logic, consisting of a phase detector and filter, adjusts the oscillator frequency and phase to compensate for the clock distribution delay. The PLL control logic compares the input clock to a feedback clock and adjusts the oscillator clock until the rising edge of the input clock aligns with the feedback clock. The PLL then "locks." PLLs typically control the phase and frequency by adjusting an analog voltage. Since using analog voltages increases the sensitivity to noise, fully-digital solutions are attractive for on-chip integration.

Delay-locked loops (DLLs) are also used for frequency synthesis. A delay line of a DLL produces a delayed version of the input clock. The control logic continuously samples the input clock as well as the feedback clock to properly adjust the delay line. Delay lines are constructed either using a voltage controlled delay or as a series of discrete delay elements. A DLL inserts a delay between the input clock and the feedback clock until the two rising edges align, effectively delaying the feedback clock by almost an entire period minus the clock distribution delay. Thus, the DLL output clock compensates for the delay in the clock distribution network, effectively removing the delay between the source clock and its loads.

However, conventional phase locked loops and delay lock loops have a number of disadvantages. Conventional digital control loop architectures do not allow for dynamic frequency transitions with an adaptable bandwidth feature. When employed in programmable logic device, conventional digital control loop architectures would require the programmable logic device to be reconfigured and require the clock synthesizer to relock to a new frequency using an initial locking procedure. That is, a conventional FPGA would not remain active during a frequency transition. Further, conventional digital control loop architectures could not take dynamic control of the frequency.

Conventional digital control loop architectures also do not need adaptive bandwidth acquisition methods because the frequency is not dynamically changed while in use, and therefore, there is no transition phase to accommodate. Conventional frequency synthesis circuits often require clocks in different clock domains to provide course and fine searching to lock to a reference clock. While phase locked loops containing programmable dividers could provide the ability to transition between different frequencies, these systems are analog systems which do not generate a locked output, but merely provide a divided output. Further, the area necessary for an adaptive bandwidth PLL loop filter is excessive. Finally, acquisition and overshoot are traded off in conventional clock management circuits, as in the case of a PLL with a single loop bandwidth during a frequency transition.

As integrated circuits continue to become more complex, there is an ongoing effort to reduce the elements of a given circuit to reduce the overall size of the circuit. Further, the timing of signals generated in an integrated circuit is becoming more complex and the transfer of signals between clock domains is increasing. The circuitry required to transfer multiple signals between clock domains not only takes up more room, but also may lead to timing errors. When sampling frequencies in different time domains, it is often necessary to compare signals in different time domains.

Accordingly, there is a need for an improved circuit for and method of sampling a signal.

SUMMARY OF THE INVENTION

A method of sampling a frequency difference in an integrated circuit is disclosed. The method comprises the steps of receiving a clock signal in a first clock domain; comparing a count of the clock signal in the first clock domain to a predetermined value N; converting the result of the comparison to a second clock domain; and generating an error signal representing the difference between the count of the first clock signal and the count of a second clock signal in the second clock domain. The method may further comprise a step of generating a sample signal used to load a counter for generating a count in the second clock domain counter with the predetermined value N. Finally, the method may further comprise a step of determining a value of N based upon the bitwidth of the counter for generating a count in the second clock domain.

According to an alternate embodiment, a method of sampling a frequency difference in an integrated circuit comprises the steps of generating a sample signal in an oscillator clock domain based upon a predetermined count N generated in a reference clock domain; incrementing a binary count of the difference between an oscillator count and the predetermined count N after a valid sample signal is received; and generating an error signal comprising a frequency difference having sign information based upon a count generated in the oscillator clock domain. For example, the step of generating an error signal may comprise a step of generating a two's complement signal based upon the difference between the oscillator count and the predetermined count N. The method may further comprise a step of generating a difference between the reference clock signal and an oscillator clock signal based upon incrementing the difference between the oscillator clock signal and the predetermined count N until receiving the sample signal.

Finally, a circuit for sampling a frequency difference in an integrated circuit is also disclosed. The circuit comprises a first counter coupled to receive pulses of a reference clock signal; a synchronizer coupled to the first counter, the synchronizer generating a sample signal when a count of the first counter is equal to a predetermined value N; a second counter coupled to receive the sample signal and the predetermined value N; and a latch coupled to latch the output of the second counter in response to the sample signal.

DETAILED DESCRIPTION OF THE DRAWINGS

Figure 1:
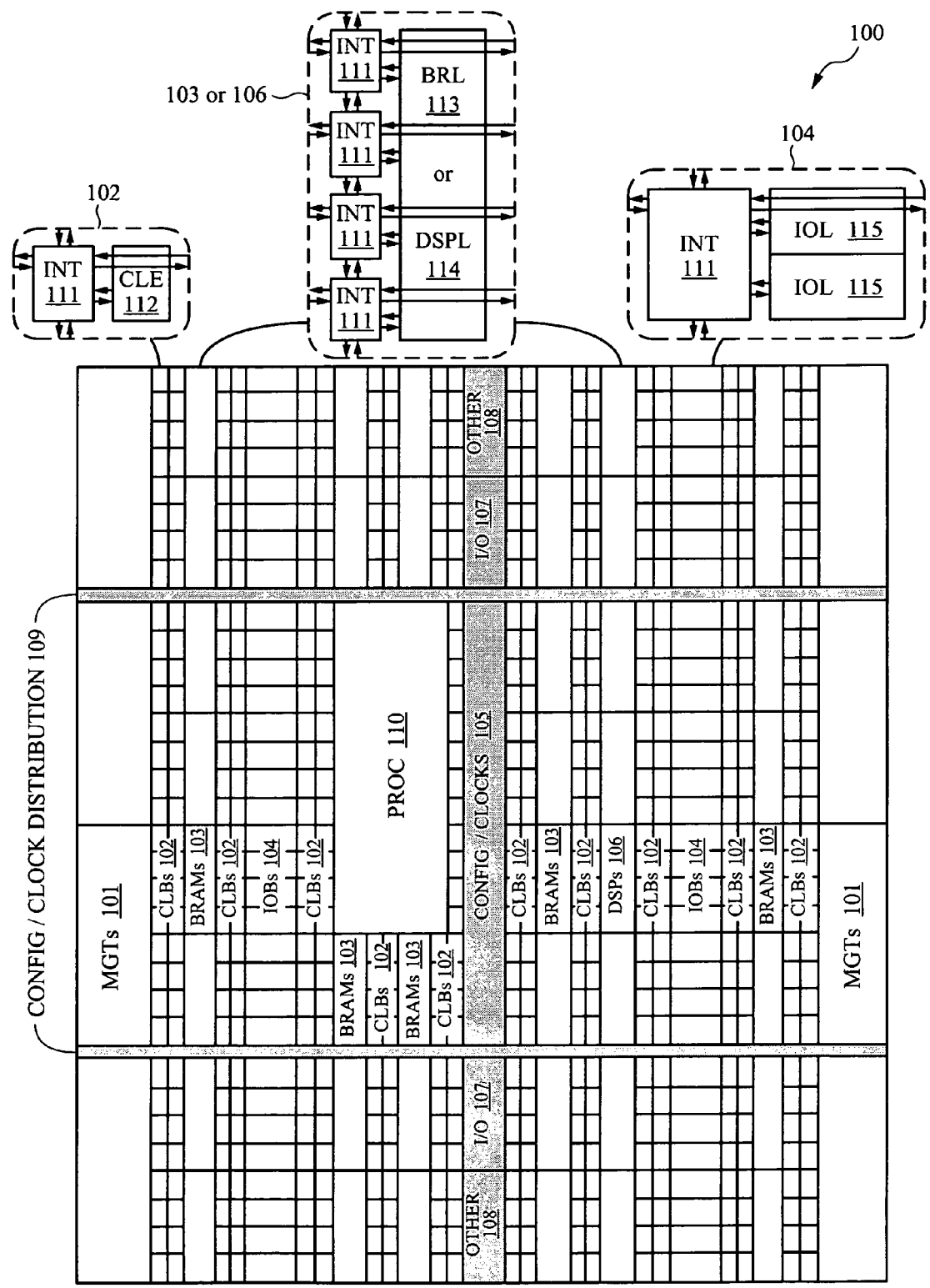
FIG. 1 is a block diagram of a circuit for implementing a frequency synthesizer and methods for changing a frequency of a clock signal according to an embodiment of the present invention.

Turning first to FIG. 1, a block diagram of a circuit for implementing circuit and methods for changing a frequency of a clock signal according to an embodiment of the present invention is shown. In particular, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (10L 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device, having memory.

Figure 2:
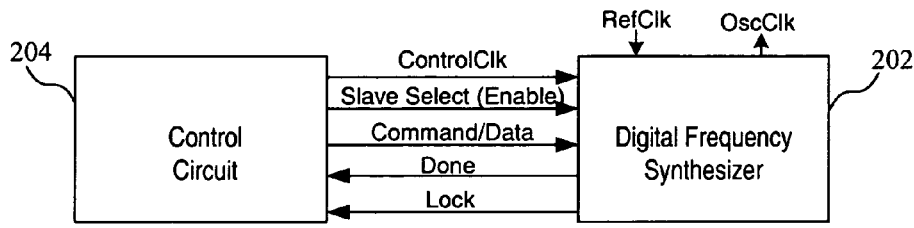
FIG. 2 is a block diagram of circuit for changing a frequency of a clock signal according to an embodiment of the present invention.

Turning now to FIG. 2, a block diagram of circuit for changing a frequency of a clock signal according to an embodiment of the present invention is shown. A digital frequency synthesizer 202 is coupled to receive a reference clock (RefClk) signal, as well as signals from a control circuit 204. The digital frequency synthesizer and control circuit could be implemented on a programmable logic device, such as the FPGA of FIG. 1, for example. The digital frequency synthesizer also couples feedback signals to the control circuit, and generates an oscillator clock (OscClk) signal. In particular, the control circuit 204 couples a plurality of control signals comprising a control clock signal, a slave select signal, also designated as an enable signal, and command/data signals. Although a control clock signal is provided, the digital frequency synthesizer could operate on a different clock, such as the reference clock. That is, the control clock signal has no restrictions and can be any type of clock with or without relation to the RefClk and the OscClk, or could be based on the RefClk or the OscClk. As will be described in more detail below, the digital frequency synthesizer provides a plurality of feedback signals, such as "Done" and "Lock" signals, back to the control circuit 204. For example, a synchronous serial peripheral interface (SPI) or some other suitable interface could be employed to transfer the various signals between the control circuit and the digital frequency synthesizer.

According to one embodiment of the invention, the digital frequency synthesizer is integrated with an external control system in a master-slave relationship, where the frequency is changed according to the commands of the external system. For example, the digital frequency synthesizer could be integrated into an FPGA, such as the FPGA of FIG. 1, and may change output frequency upon the commands of the FPGA fabric without the need for FPGA reconfiguration. The circuit communicates directly with the FPGA fabric, such as through a serial interface, in order to give the FPGA complete control over the synthesized frequency with a "master-slave" relationship. Alternatively, a digital frequency synthesizer according another embodiment of the present invention could be implemented on an integrated circuit, and could be coupled to some external device or system which controls the digital frequency synthesizer according to other embodiments of the present invention. Although programmable logic devices are described by way of example, and provide significant advantages in implementing the various embodiments of the digital frequency synthesizer, the circuits and methods could be employed on any type of integrated circuit or in any type of circuit or system requiring a clock.

Figure 3:
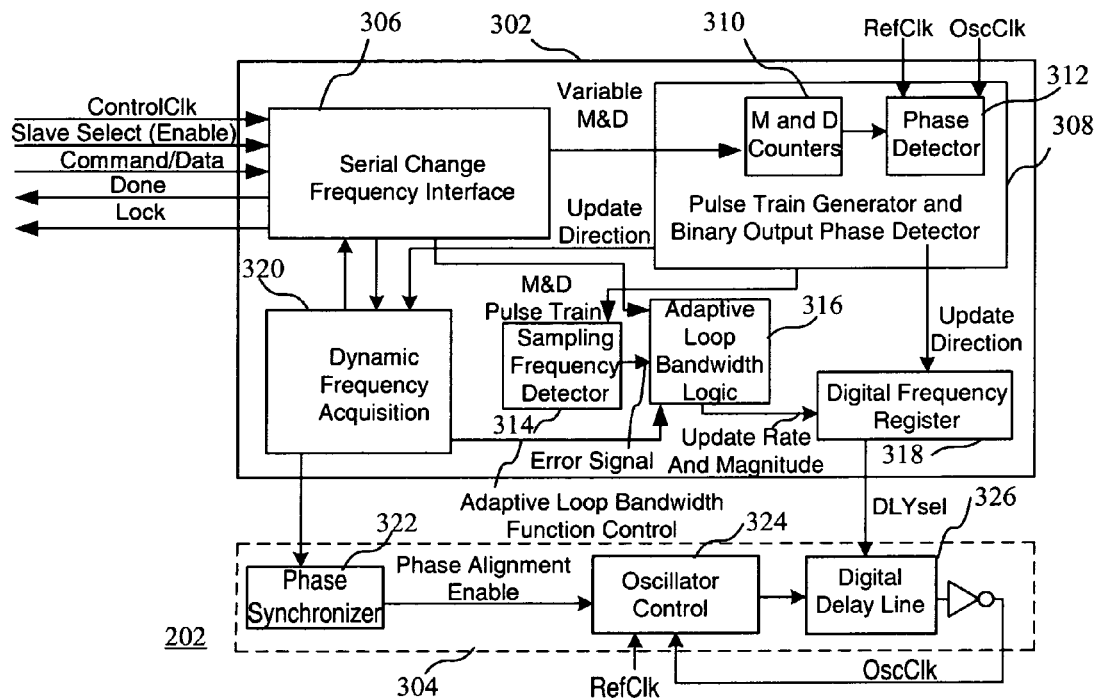
FIG. 3 is a block diagram of the digital frequency synthesizer 202 of FIG. 2 according to an embodiment of the present invention.

Turning now to FIG. 3, a block diagram of the digital frequency synthesizer 202 of FIG. 2 according to an embodiment of the present invention is shown. The circuit of FIG. 3 enables dynamic frequency synthesis, and in particular, dynamically changing the output frequency (i.e. changing the frequency of the output clock while the output clock is still valid) of a programmable digital frequency synthesizer. The circuit also provides adaptive loop bandwidth control to optimize the transition from an initial frequency to a next frequency and all subsequent frequencies. The circuit of FIG. 3 receives an input clock (RefClk) and generates an output clock (OscClk) with a dynamically controllable (M/D) frequency ratio. When implemented in an FPGA, the FPGA fabric has dynamic control. That is, no full-FPGA reconfiguration is needed, and the M and D values of the digital frequency synthesizer may be changed, where a dynamic frequency acquisition state machine locks onto the newly desired frequency.

Figure 4:
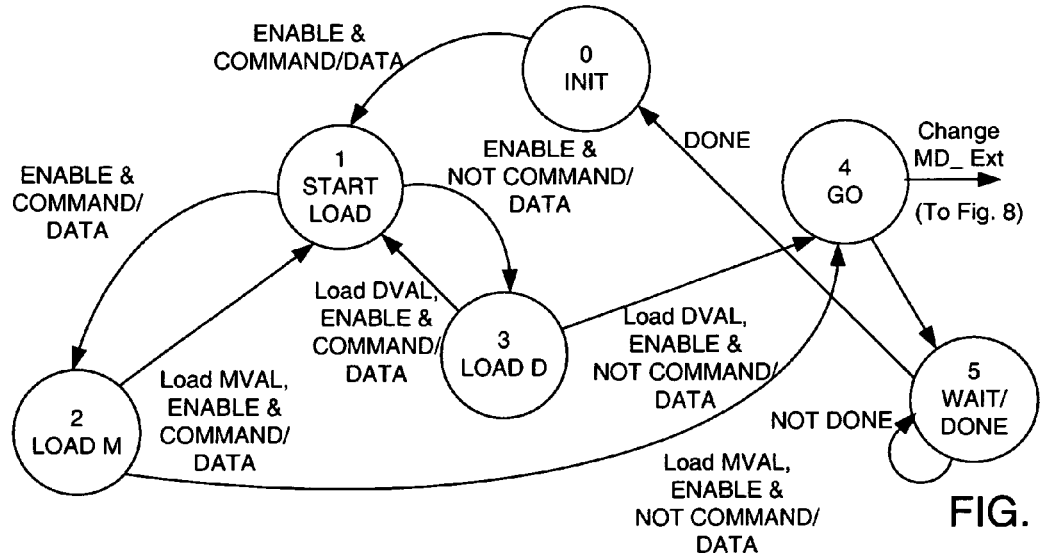
FIG. 4 is a state diagram showing the loading of updated M or D values of a frequency synthesizer according to an embodiment of the present invention.
Figure 5:
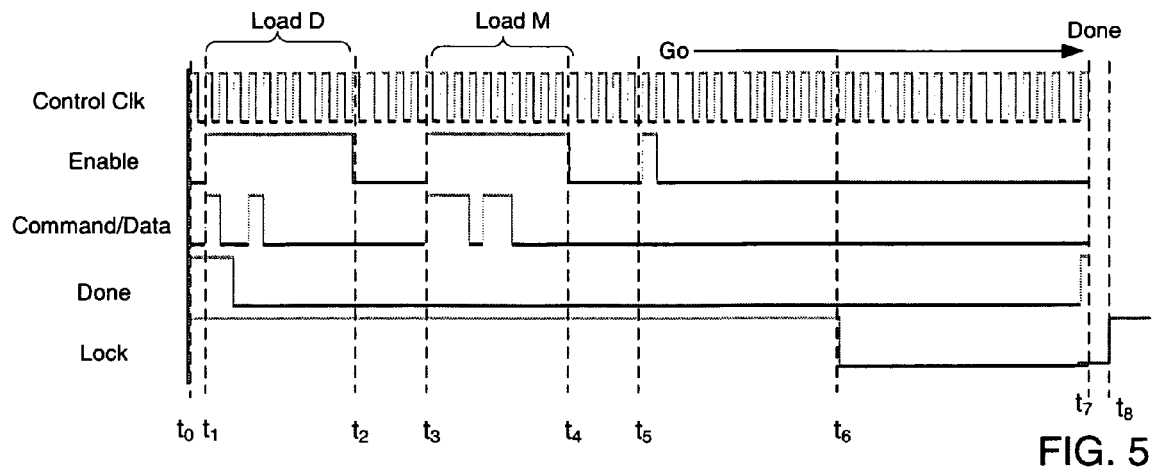
FIG. 5 is a waveform showing the loading of M and D values according to an embodiment of the present invention.

Referring specifically to FIG. 3, an oscillator control portion 302 is coupled to receive the control signals, and generate variable M and D values to control a clock generator 304, according to the state diagram of FIG. 4 and the timing diagram of FIG. 5. The control signals are coupled to a serial change frequency interface 306. The serial change frequency interface runs off of the control clock (ControlClk) signal which has no required phase or frequency relationship to either REFCLK or OSCCLK, giving the circuit flexibility to use REFCLK, OSCCLK, or a completely independent clock for the control clock. The interface preferably uses three separate commands to communicate with the frequency synthesizer. In particular, two command signals (i.e. enable, command/data) are coupled to the digital frequency synthesizer, and acknowledge information is received from the synthesizer (i.e. done, lock). The variable M and D values are frequency synthesizer values coupled to a Pulse Train Generator and Binary Output Phase Detector 308, which comprises M and D counters 310 and a Phase Detector 312. M and D pulse trains, which are well known in the art, are coupled to a sampling frequency detector 314, which will be described in more detail in reference to FIG. 9.

The sampling frequency detector 314 generates an error signal which is coupled to an adaptive loop bandwidth logic block 316. A sampling frequency detector detects differences from the desired frequency (such as a new frequency based upon a new M or D value or a changed reference frequency) and the current frequency to generate the error signal. The error signal enables the adaptive loop bandwidth mechanism to select the best delay select (DLYsel) values for the digital delay line so that the digital frequency synthesizer will quickly lock to the reference frequency. The adaptive loop bandwidth logic block 316 outputs update values, such as one or more update rates and update magnitudes to a digital frequency register 318. Alternatively, the adaptive loop bandwidth logic block 316 could receive control signals from other elements of the system by way of the serial change frequency interface 306 to select the correct update rate and magnitude values. As will be described in more detail in reference to FIG. 10, the digital frequency register 318 receives update rate, update magnitude and update direction signals, and outputs delay values for one or more digital delay lines of the digitally controllable oscillator 304.

The adaptive loop bandwidth logic block 316 changes the digital loop bandwidth to optimize the frequency transition behavior of the circuit. In general, the adaptive bandwidth logic block increases the update rate and the update magnitude when there are large differences in frequency, and decreases the update rate and the update magnitude when there are small differences in frequency, in response to the error signal. The update rates and/or update magnitudes can be controlled non-linearly. The adaptive loop bandwidth logic block enables flexible processing of the error signals, and therefore the frequency transition behavior can be tuned to give different characteristics. Examples of tables for generating delay select values, and the flexibility provided by the adaptive bandwidth logic circuit 316, will be described in reference to FIG. 11.

A dynamic frequency acquisition block 320 is also coupled to receive signals from the serial change frequency interface, as well as an update direction signal from the Pulse Train Generator and Binary Output Phase Detector 308. The dynamic frequency acquisition block 320 controls the clock generator 304 to enable phase alignment, as well as provides adaptive bandwidth function control signals to the adaptive loop bandwidth logic block 316. The operation of the dynamic frequency acquisition block will be described in detail in reference to FIG. 8. Accordingly, the frequency transition incorporates an adaptive digital loop bandwidth that allows the frequency transition to be quick and also minimizes frequency overshoot, as will be described below in reference to FIGS. 9-12. The digital loop filter reacts with quicker frequency transition (for higher bandwidths) or with slower frequency transition (for lower bandwidths) depending on the relation between the current output frequency and the desired output frequency, the mode of frequency acquisition (e.g. hard phase aligned or frequency aligned operation), and the current state of the acquisition procedure.

The clock generator 304 could comprise a phase synchronizer 322 which couples a phase alignment enable signal to an oscillator control circuit 324. A phase synchronizer 322 generally provides phase alignment as described in more detail in reference to FIG. 7. Finally, a digital delay line 326 is coupled to receive the output of an oscillator control circuit 324 and a delay select value from the digital frequency register 318. The digital delay line could be, for example, a counter-controlled delay, as described for example in commonly assigned U.S. application Ser. No. 11/015,674, filed on Dec. 17, 2004, entitled "Counter-Controlled Delay Line" by Alireza S. Kaviani, the entire application of which is incorporated herein by reference.

Figure 8:
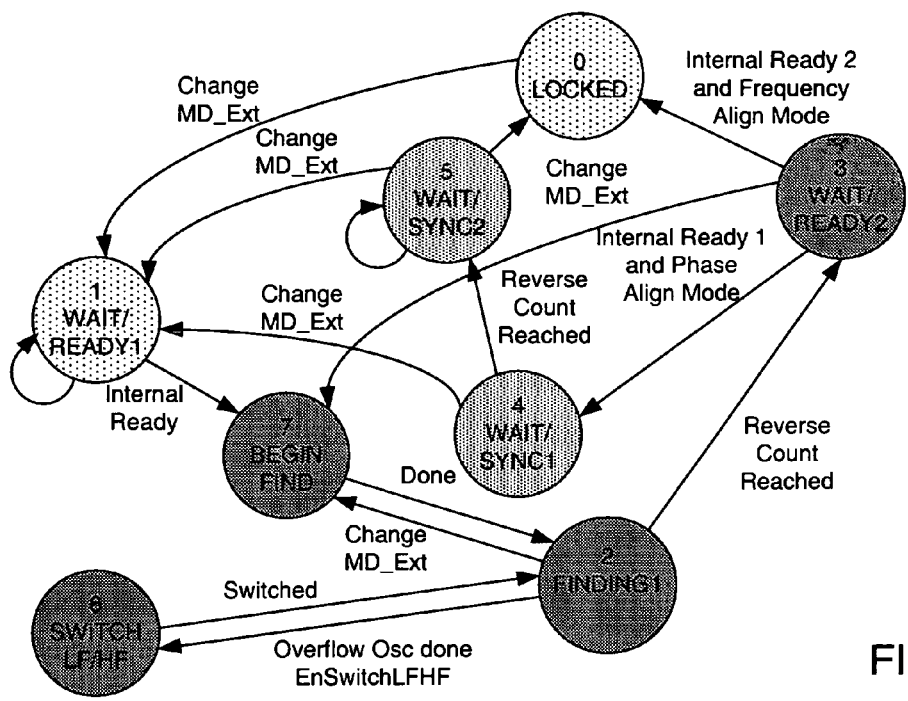
FIG. 8 is a state diagram showing the locking of a generated clock signal according to an embodiment of the present invention.

Turning now to FIG. 4, a state diagram shows the loading of updated M or D values of a frequency synthesizer according to an embodiment of the present invention which could be implemented in the dynamic frequency acquisition block 320, for example. After an initialization state 0 INIT, the operation of the digital frequency synthesizer moves to a state 1 START LOAD in response to an enable (ENABLE) signal and a command (COMMAND/DATA) signal. If the digital frequency synthesizer receives an enable signal and a command or data (COMMAND/DATA) signal when in state 1 (i.e. indicating that an M value is being changed), the operation of the circuit moves to a state 2 LOAD M for loading a new M value. Otherwise, the digital frequency synthesizer receives an ENABLE signal and an NOT COMMAND/DATA signal, in which case the digital frequency synthesizer moves to a state 3 LOAD D for loading a new D value. When in state 2, if the digital frequency synthesizer receives a load MVAL, an ENABLE and a COMMAND/DATA command, indicating that there is another value of M to load, the circuit returns to state 1 to start the loading. Otherwise, if the digital frequency synthesizer receives a load MVAL, an ENABLE and a NOT COMMAND/DATA command, the digital frequency synthesizer moves to a state 4 GO, indicating that the frequency of the output clock could be generated based upon the loaded values. Similarly, when in state 3, if the digital frequency synthesizer receives a load DVAL, an ENABLE and a COMMAND/DATA command, indicating that there is another value of D to load, the circuit returns to state 1 to start the loading. Otherwise, if the digital frequency synthesizer receives a load DMVAL, an ENABLE and a NOT COMMAND/DATA command, the digital frequency synthesizer moves to a state 4 GO, indicating that the frequency of the output clock could be generated based upon the loaded values. Moving to a state 4 GO causes a Change MD_ext signal to be loaded, indicating that a new external value has been generated to change the frequency of the digital frequency synthesizer. The Change MD_ext signal is received by the state machine of FIG. 8 which is constantly running in parallel with this state machine. Running these state machines in parallel allows the loading state machine of FIG. 4 to acquire new M and D values while the locking state machine of FIG. 8 is still locking onto the previously loaded M and D values, thereby pipelining the values to optimize for fast hopping between frequencies. The digital frequency synthesizer automatically goes to a state 5 WAIT/DONE, until it returns to the initialization state 0. That is, the state machine will transition to state 5 without waiting once it reaches state 4. The Done signal indicates when the systems M and D registers have been properly loaded with the new M and D values. By being "Done," the state machine of FIG. 8 is ready to go find the desired frequency to lock upon, and simultaneously, state machine of FIG. 4 is ready to load in the next M or D values, enabling pipelining as discussed above.

Turning now to FIG. 5, a waveform shows the loading of M and D values according to an embodiment of the present invention. An enable signal between time $t_1$ and $t_2$ enables loading data, in this case data related to a D value. When the enable again goes high at a time $t_3$, additional data is loaded, in this case data related to an M value. After an enable is received at time $t_4$, the digital frequency synthesizer attempts to lock to the new frequency (as indicated by the GO state in FIG. 5). The Go command shown in FIG. 5 signals the frequency synthesizer to acquire the frequency determined by the most recently loaded M and D values. The locking to a new frequency will be described in more detail in reference to FIG. 8.

According to one aspect of FIG. 5, the state machine, which reads the command/data signal when the enable signal is true, allows the command to be broken into different segments. That is, the state machine does not require the enable signal to be continuously true for 10 consecutive cycles for the Load D and Load M commands which may have 10 bits. For instance, a Load D command may be started with enable being true for 5 consecutive cycles, followed by 3 cycles of enable being false, and then 5 cycles of enable being true. By allowing the command to be broken into parts, the user has additional flexibility in communicating from the control circuit to the frequency synthesizer. In addition, the interface allows for pipelining the load values and the Go command. While the frequency synthesizer is acquiring the current frequency from changed M and D values, a new set of values can be simultaneously loaded into the system. The Go command is optimally short and valid for use any time after either or both the M and D values have changed.

Figure 6:
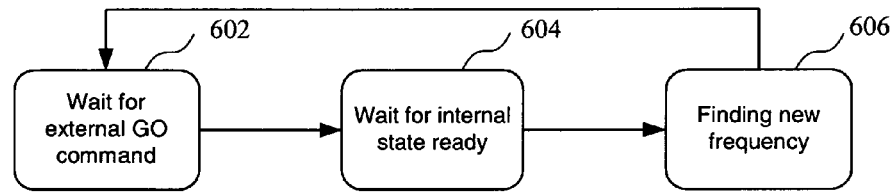
FIG. 6 is a flow diagram showing a method of transitioning frequencies while in frequency alignment mode according to an embodiment of the present invention.

The acquisition of the new frequency after the "Go" command can be done both in a frequency aligned mode and in a phase aligned mode of the synthesizer, as will be described in more detail in the state machine of FIG. 8. Referring to the flow diagram of FIG. 6, a method of frequency alignment according to an embodiment of the present invention is shown. The digital frequency synthesizer waits for an external go command at a step 602, and then waits for an internal state ready signal at a step 604 before finding the new frequency at a step 606. The frequency aligned mode uses the adaptive loop bandwidth logic to control the oscillator only through the use of the frequency control signal (i.e. the delay select valid signal coupled to the digital delay line). Once the signal direction toggles a specified number of times, the state machine knows the correct frequency has been reached and triggers the "Lock" acknowledgement to the fabric. A circuit for providing frequency alignment is described in a patent application filed on the same date as the present application by the Assignee of the present application, entitled "CIRCUIT FOR AND METHOD OF GENERATING A FREQUENCY ALIGNED CLOCK SIGNAL," by Maheen A. Samad, et. al., the entire application of which is incorporated by reference.

Figure 7:
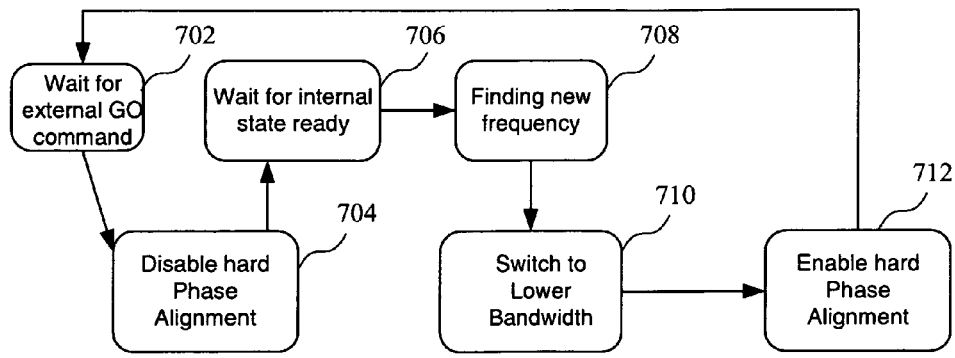
FIG. 7 is a flow diagram showing a method of transitioning frequencies while in hard phase alignment mode according to an embodiment of the present invention.

In contrast, the flow diagram of FIG. 7 shows a method of phase alignment, and in particular hard phase alignment according to an embodiment of the present invention. The phase alignment preferably utilizes the frequency aligned mode of operation for the majority of the frequency transition phase in order to avoid narrow pulses and utilize the adaptive bandwidth. When the system is close to the correct new frequency, the hard phase alignment is then enabled. This prevents narrow or wide pulses and ensures phase alignment when the "Lock" signal is triggered. In operation, the digital frequency synthesizer waits for an external GO command at a step 702. Hard phase alignment is disabled at a step 704, and the digital frequency synthesizer waits for an internal state ready signal at a step 706. After an internal state ready signal is received, indicating that the internal circuits are ready to change the M and D values, the circuit finds a new frequency at a step 708. The circuit then switches to a lower bandwidth at a step 710. Hard phase alignment is then enabled at a step 712. Hard phase alignment could be performed as described for example in U.S. Pat. No. 6,384,647, the entire patent of which is incorporated by reference. The clock generator of U.S. Pat. No. 6,384,647 is controlled by a phase synchronizer which periodically replaces the generated clock signal OscClk as it oscillates through the phase synchronizer with the reference clock signal RefClk in order to perform hard phase alignment.

Turning now to FIG. 8, a state diagram shows the locking of generated clock signal according to an embodiment of the present invention. Different shading in the states of the state diagram is shown for states having similar bandwidth functions. For example, states 0 and 1 are shown as belonging to a similar initialization state. After a Change MD_Ext signal is received after the synthesizer is locked at a state 0, the digital frequency synthesizer locks at a state 1 WAIT/READY 1. After an internal ready signal is received, the digital frequency synthesizer enters a state 7 BEGIN/FIND.

After the digital frequency synthesizer is done with an initial stage of acquiring the frequency, the digital frequency synthesizer enters a state 2 FINDING 1. If a reverse count of a phase detector is reached, indicating that the circuit has locked, the digital frequency synthesizer enters a state 3 WAIT/READY 2. If a reverse count is not reached and the system, according to one embodiment including a delay line with multiple frequency modes, overflows the range of the current frequency mode, the digital frequency synthesizer enters a state 6 SWITCHLF/HF mode which enables switching the frequency locking function from a low frequency mode to a high frequency mode or vice versa, and returns to state 2 FINGING 1 after the frequency mode has been switched. As can be seen each of the states 7, 2, 3, and 6 are each shaded similarly, and relate to initially acquiring a frequency.

Finally, when in state 3 WAIT/READY2 after a reverse count is received, it is determined whether the digital frequency synthesizer will frequency align the OscClk to the RefClk, or perform phase alignment. If phase alignment is performed, the digital frequency synthesizer will enter state 4 WAIT/SYNC1 (after an Internal Ready 1 and Phase Align Mode signal is received) until a reverse count of a phase detector is received, in which case the frequency synthesizer will enter state 5 WAIT/SYNC2 until frequency lock is achieved. Otherwise, frequency alignment is performed if an Internal Ready 2 and Frequency Align Mode signal is received when in state 3. As can be seen, states 4 and 5 are similarly shaded to show similar bandwidth functions related to acquiring phase alignment. Finally, when in states 4 and 5, if a Change MD_ext is received, the digital frequency synthesizer will return to state 1 WAIT/READY 1. Finally, when In state 3, if a Change MD_Ext signal is received, the digital frequency synthesizer will return to state 7 BEGIN/FIND.

Figure 9:
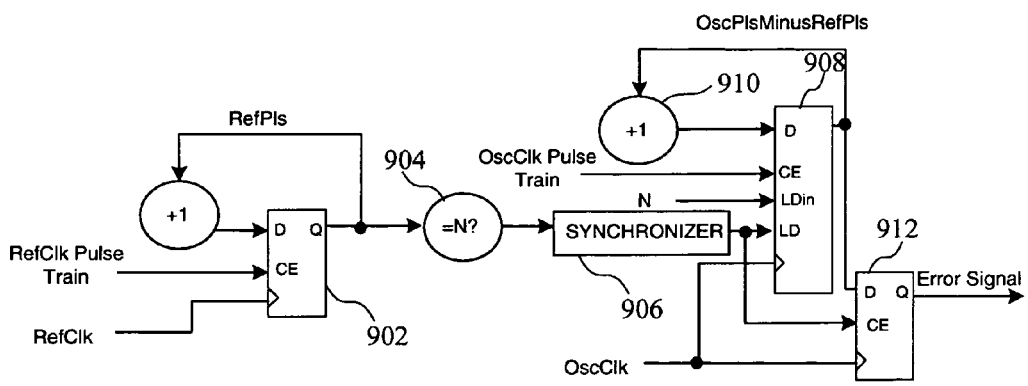
FIG. 9 is a block diagram of a sampling frequency detector according to an embodiment of the present invention.

Turning now to FIG. 9, a block diagram of a sampling frequency detector according to an embodiment of the present invention is shown. The sampling frequency detector samples the frequency of the clocks and gives an error signal based on the difference between the OSCCLK and REFCLK frequency over a configurable sampling period N. In particular, a register 902, which is clocked by the reference clock, receives the reference clock pulse train at a clock enable input, and an incremented value of its output is fed back to its input. The output of the register 902 is coupled to a comparator 904 which compares the number of reference pulses to a predetermined number. Because the oscillator clock pulse train is in a different clock domain, a synchronizer 906 generates an output signal in a common clock domain, such as the oscillator clock domain, and generates an output to the LD terminal of the register 908. The output of the register 908 is also incremented and fed back to an input of the register 908. According, if there is a difference between the oscillator pulse and the reference pulse, an error signal is generated by a register 912. The magnitude of the error signal is then used to change the value of the delay select (DLYsel) signal, which changes the delay of the delay register, as will be described in more detail in reference to FIG. 10. The sampling frequency detector gives a snapshot of the frequency difference over the sampling period N and continuously samples the frequency while it runs, thereby constantly outputting the "current" frequency error.

According to one aspect of the circuit of FIG. 9, only a single count value generated in the reference clock domain is required to generate an error signal. By transferring only a single signal across the clock domains to signify N REFCLK Pulse Train periods have occurred, the necessary logic to safely synchronize between domains is minimized. The frequency detector compares the frequency over a period of N REFCLK PulseTrain pulses and outputs a new Error Signal every N REFCLK PulseTrain pulses, thereby sampling the frequency difference and outputting each sample. Comparing the OSCCLK Pulse Train Count (OSCPls) to the REFCLK Pulse Train Count (REFPls) indicates how many extra or fewer OSCCLK cycles occurred, and therefore, the relative frequency difference sampled over a time window of N REF- CLK Pulse Train pulses. Because the REFPls will be equal to N when the difference between the OCSPls and REFPls signal is latched, the value of N may be loaded into the counter operating in the oscillator clock domain and represent the REFPls value which is subtracted from OSCPls, as will be described in more detail below. The portion of the circuit comprising register 902 operating as a counter in the REF-CLK domain simply counts pulses in the REFCLK domain and outputs a pulse when N REFCLK Pulse Train pulses have occurred. The time between consecutive occurrences of this signal is the sampling window of the frequency detector.

The synchronized single signal or "sample" signal in the REFCLK domain output by the synchronizer 906 is used to both load the register 908 operating as a counter in the oscillator clock domain and to enable the output register 912 to hold the latest sampled frequency error. In order to optimize the use of digital logic, N preferably has a specific relationship to the bit width of the counter implemented in the oscillator clock domain. In particular, N preferably equals $2^{(bitwidth-1)}$. For example, if the counter has 4 bits, then $N=2^3=8$. This bitwidth specification allows the detector to output a proper 2's compliment representation of the error, and therefore provides a frequency difference signal having sign information to indicate whether the difference is a positive or negative number. Accordingly, no further processing is required after the error signal is generated in order to determine the sign (or direction) of the difference between the clock pulse trains. The output of the counter in the OSCCLK domain is the oscillator domain pulse train count minus the reference domain pulse train count which is valid at the moment the sample signal output by the synchronizer is true (i.e. when the count of the reference pulse is equal to N). The oscillator domain counter is preferably loaded with the value of N each time the Sample signal is triggered and used in the "OSCPlsMinusREFPls" determination. By way of example, LDin could be loaded with 4'b1000. During the sample time interval, each oscillator pulse causes the counter output to count up using binary counting. The oscillator domain pulse train count is reset to zero when the sample signal is received.

If there were exactly N oscillator counts during N reference counts until the next sample signal is received, the digital output from the counter in the oscillator clock domain would be 0, signifying that the frequencies are matched. For example, OSCPlsMinusRefPls would be equal to 4'b0000 in that case. If there were more than N OSCCLK counts since the last sample signal, the output would surpass 0 and give a positive 2's compliment number signifying a faster OSCCLK frequency. For example, OSCPlsMinusREFPls would be equal to 4'b0010 in that case, indicating that 2 more OSCCLK pulses than REFCLK pulses. If there were less than N OSCCLK counts since the last sample signal, the output would not reach 0 and give a negative 2's compliment number signifying a slower OSCCLK frequency. For example, OSCPlsMinusREFPls would be equal to 4'b1110 in that case, indicating 2 less OSCCLK pulses than REFCLK pulses. Therefore, the register 912 latches the OSCPlsMinusREFPls error count at each occurrence of a sample signal from the synchronizer. During the sample signal, the error is actually valid and may be latched as a measure of the frequency error between the two clocks over the previous sampling period.

Figure 10:
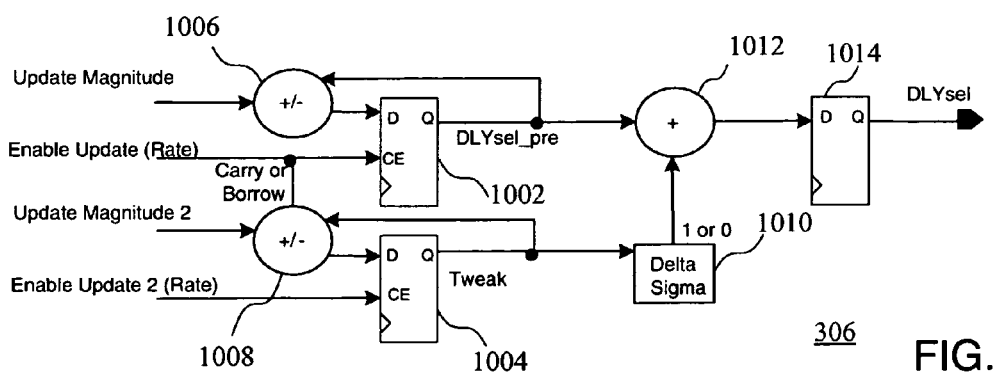
FIG. 10 is a block diagram of digital frequency register according to an embodiment of the present invention.

Turning now to FIG. 10, a block diagram of digital frequency register for generating a delay select (DLYsel) signal according to an embodiment of the present invention is shown. The digital frequency register adjusts the course and fine delay of a delay line, and comprises a delay select register 1002 and a tweak register 1004. The delay select register and tweak register receive an addition or subtraction signal at an adder/subtractor circuit, 1006 and 1008, respectively. However, according to the circuit of FIG. 10, separate update magnitude and update rate values are provided to the delay select register 1002 and the delay select register 1004, which enables an adaptive features of the digital frequency synthesizer. An output of the tweak register is also coupled to the adder/subtractor circuit 1008, and a delta sigma circuit 1010. The output of the tweak register could be, for example, the least significant bits of the clock period selection signal. Finally, an adder 1012 adds the output of the delay select register signal (DLYSel_pre) and the output of the delta sigma circuit, and couples the sum to a register 1014 which generates the DLYsel signal.

While enabling the generation of the DLYsel signal in a single binary frequency search, the circuit of FIG. 10 also includes configuration options that allow optimal transition behavior for different ranges of frequency transitions. The embodiments of the present invention can enhance design techniques with frequency scaling and energy management flexibility, and provides adaptive performance tuning of systems running on the variable frequency synthesizer. As shown for example in FIG. 11, different tables can be accessed by the adaptive loop bandwidth logic block 316 to provide update rate and magnitude values to the digital frequency register 318 to generate the appropriate delay select signals to the delay line. Referring also to the state diagram for locking to a new frequency of FIG. 8, which may be generated by a new value of M or D, a different table may be selected depending upon whether frequency alignment or phase alignment is performed after state 3 WAIT/READY2. Both the update rate and the update magnitude are generally greater for greater frequency detector error signals.

As shown in Table 1, the update magnitude 1 (for coarse adjustment of the delay select value in FIG. 10) is not a linear value, but is a multiple of the error signal. As can be seen, the error rate magnitude 1 is reduced from 3 to ½ times the error value as the frequency detector error signal decreases. Although non-linear values are shown for the update magnitude 1, they could also be used for other values in the table. The update rates or update magnitudes could also be discrete units, such as shown for Update Rate 1, Update Magnitude 2 and Update Rate 2, rather than a multiple of the error signal. As can be seen in Table 2, the update magnitude and update rates are integral units. In the example of Table 2, the update rate 1 and update magnitude 1 values are zero for all frequency detector error signals, and only the update magnitude 2 and update rate 2 are used to lock to the reference frequency.

Figures 11, 12:
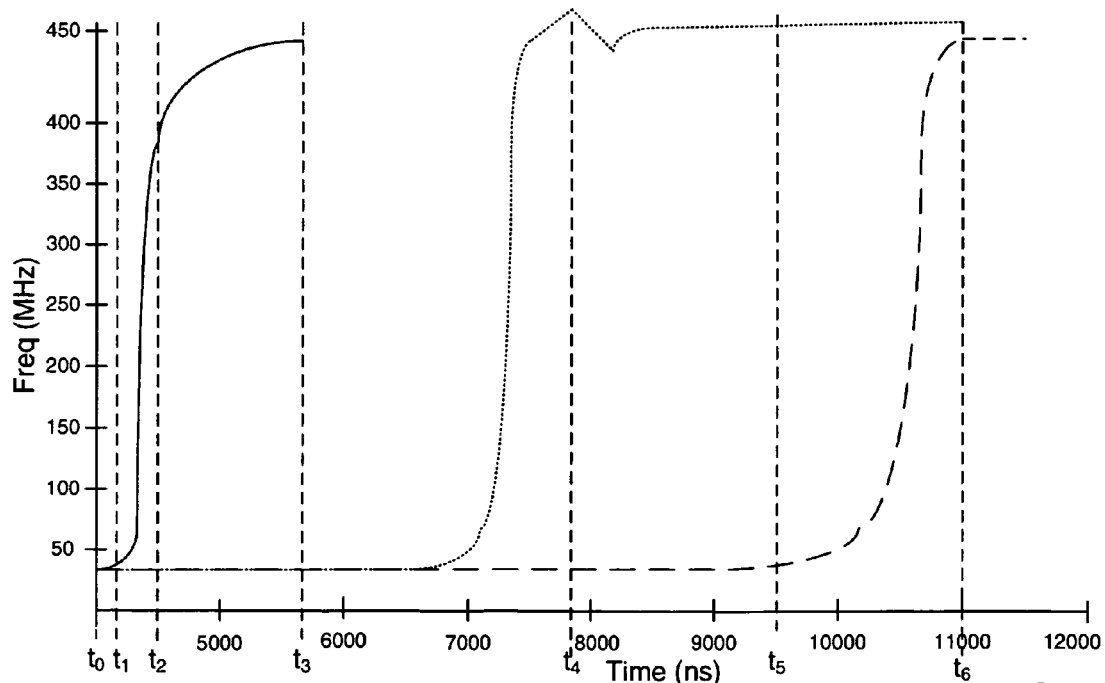
FIG. 11 provides an example of tables for generating delay select values by the circuit of FIG. 10 according to an embodiment of the present invention.
FIG. 12 is a graph showing the locking of a signal employing circuits or methods of embodiments of the present invention.

While a table of a plurality of tables could be selected for a given transition to lock to a new target frequency, the tables could be selected during the locking process in order to minimize locking time and reduce overshoot, as will be shown in FIG. 12. When locking to a frequency according to the state machine of FIG. 8, the Adaptive Loop Bandwidth Logic block may apply update values from different tables depending upon the current state. For example, the Adaptive Loop Bandwidth Logic may apply update values from Table 1 until reaching state 3, and the may apply update values from Table 2 for states 4 and 5. Therefore, in addition to providing adaptive performance by providing different update values for different error signals, FIG. 11 provides further adaptability by enabling the selection of a different table for different frequency transitions, as well as the application of update values from a plurality of tables during a single locking period for a frequency transition. While values of the tables are shown as integral units or multiples of the error value, other variations of update values for given error signals could be employed. For example, the variations of a given update value could be logarithmic, exponential, piecemeal, etc.

The digital frequency register of FIG. 10 with a digital control loop filter has the benefit of allowing non-linear phase/frequency-detector error signal processing and frequency control to provide improved locking to the reference frequency. The algorithmic constraints of a conventional analog loop filter (depending largely on resistances and capacitances) are not present in a digital system, enabling the digital system to take advantage of digital math and a wide range of algorithm defined control. The use of an adaptive bandwidth loop filter during frequency transitions allows the circuit to quickly acquire the new frequency while avoiding overshoot of the intended frequency. The transitions between frequencies may be optimized for reducing overshoot and minimizing frequency lock time, while providing a well-behaved, glitch-free clocking frequency output that may still be used during the frequency transition, as will be shown in the graph of FIG. 12.

Turning now to FIG. 12, a graph shows the locking of a signal employing circuits of some embodiments of the present invention. FIG. 12 shows a frequency transition (indicated with the long dashed line) using a first conventional digital frequency synthesizer having a constant low update rate and magnitude where the lock time was long, but with little overshoot. As can be seen, the first conventional frequency synthesizer does not lock until time $t_6$. In contrast, the frequency transition (indicated with short dashed lines) according to a different conventional frequency synthesizer shows the opposite situation where a constant high update rate and magnitude of a conventional circuit provides a short lock time but high overshoot. As can be seen, the circuit locks earlier at a time $t_5$, but experiences significant overshoot at $t_4$. However, as shown in the solid line according to the digital frequency synthesizer of FIG. 3, the use of adjustable loop bandwidth generates a frequency transition at time $t_2$ that is both fast in the beginning, but slower when the frequency is close to target to prevent overshoot. It should be noted that throughout the transition generated by the circuit of FIG. 3, by employing hard phase alignment as described in FIG. 7, there are no narrow pulses created in the transitions, making the generated clock usable during the transition.

Figure 13:
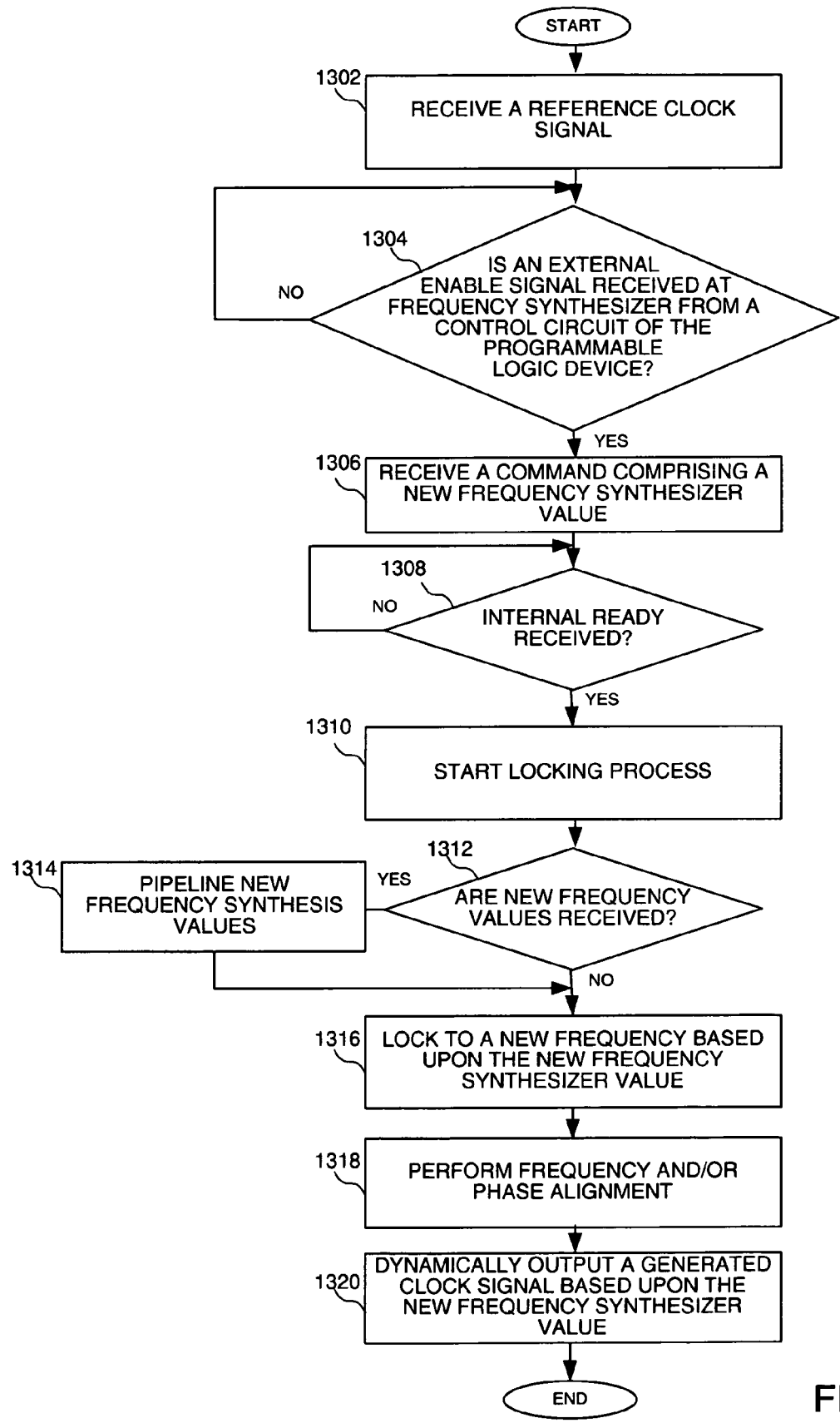
FIG. 13 is a flow chart showing a method of dynamically outputting a generated clock signal according to an embodiment of the present invention.

Turning now to FIG. 13, a flow chart shows a method of dynamically outputting a generated clock signal according to an embodiment of the present invention. The methods of FIGS. 13 and 14 could be performed using the circuits of FIGS. 1-10 or any other suitable circuits. A reference clock signal is received at a step 1302. An external enable signal is received at the frequency synthesizer from a control circuit at a step 1304. A command comprising a new frequency synthesizer value is received at a step 1306. It is then determined whether an internal ready is received at a step 1308. The locking process is started at a step 1310. It is also determined whether new frequency values are received at a step 1312. New frequency synthesis values are pipelined at a step 1314. A new frequency based upon the new frequency synthesizer value is locked at a step 1316. Frequency and/or phase alignment is then performed at a step 1318. A generated clock signal is then dynamically output based upon the new frequency synthesizer value at a step 1320.

Figure 14:
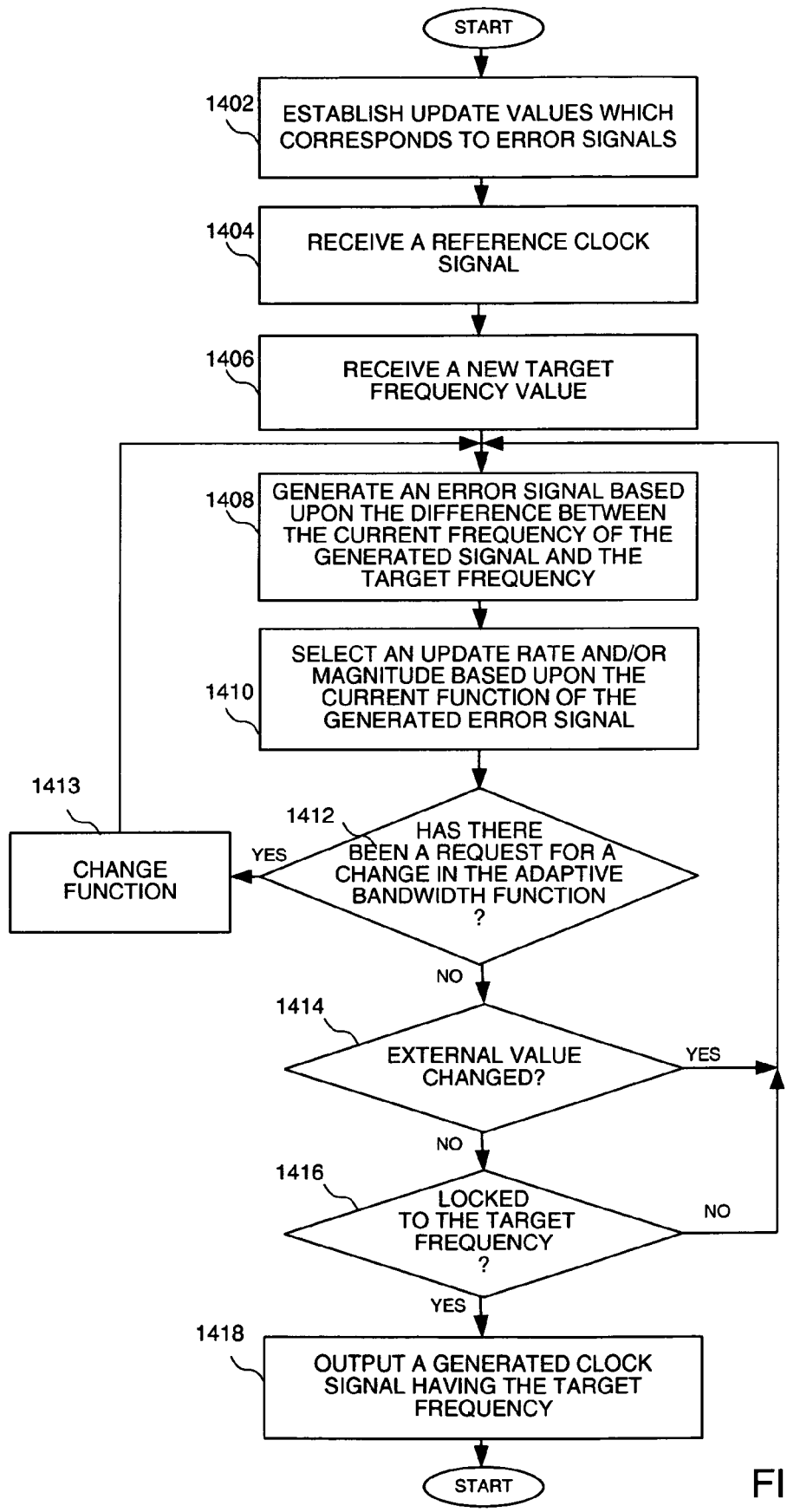
FIG. 14 is a method of adaptively adjusting a digital loop bandwidth according to an embodiment the present invention.

Turning now to FIG. 14, a method of adaptively adjusting a digital loop bandwidth according to an embodiment the present invention is shown. Update values which correspond to error signals are established at a step 1402. A reference clock signal is received at a step 1404. A new target frequency value is received at a step 1406. The new target frequency value could be based upon a change in an M or D value, or a change in the reference frequency. An error magnitude signal is generated based upon the difference between the current frequency of the generated signal and the new target frequency at a step 1408. An update rate and/or update magnitude is selected based upon a detected error signal at a step 1410. As described above with respect to FIG. 9, the error detection circuit is continuously running and generating an error signal. Accordingly, the steps of generating an error magnitude signal and error values are continuously performed. It is also determined whether there has been a request for a change in the function at a step 1412. If so, the function is changed at step 1413. For example, a new update value from a table, such as one of the tables shown in FIG. 11, could be used depending upon the current state in the state diagram. It is also determined whether an external value, such as a value of M or D or the reference frequency itself, has changed at a step 1414, in which case new update values may be selected at step 1410 based upon an error signal generated at step 1408. It is then determined whether a new frequency based upon the new frequency synthesizer value is locked to at a step 1416. If not, new update values may be selected at step 1410 based upon an error signal generated at step 1408. If so, a generated clock signal having the new frequency is output at a step 1418.

It can therefore be appreciated that the new and novel circuit for and method of sampling a frequency difference in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of sampling a frequency difference in an integrated circuit, said method comprising the steps of:
   receiving a first clock signal in a first clock domain;
   comparing a count of said first clock signal in said first clock domain to a predetermined value N;
   converting a result of said comparison to a second clock domain;
   generating a sample signal used to load a counter for generating a count of a second clock signal in said second clock domain with said predetermined value N;
   coupling said sample signal to an enable input of an output register operating in said second clock domain;
   latching, to said output register in response to said sample signal, a count associated with a difference between a count of said first clock signal and a count of said second clock signal in said second clock domain using said result of said comparison converted to said second clock domain; and
   generating an error signal representing said difference between said count of said first clock signal and said count of said second clock in said second clock domain.

2. The method of claim 1 further comprising a step of incrementing said count of said first clock signal in said first clock domain until said count equals said predetermined value N.

3. The method of claim 1 wherein said step of generating an error signal comprises a step of generating an error signal based upon clock signals detected over N reference clock pulses in said first clock domain.

4. The method of claim 1 further comprising a step of determining a value of N based upon a bitwidth of said counter for generating a count in said second clock domain.

5. The method of claim 4 wherein said step of determining a value of N based upon a bitwidth of said counter for generating a count in said second clock domain comprises a step of determining N such that N equals $2^{bitwidth-1}$.

6. A method of sampling a frequency difference in an integrated circuit, said method comprising the steps of:
determining a value of N based upon a bitwidth of a counter used in an oscillator clock domain;
generating a sample signal in said oscillator clock domain based upon a predetermined count having said value of N generated in a reference clock domain;
incrementing a binary count of a difference between an oscillator count and said predetermined count having said value of N after a valid sample signal is received; and
generating an error signal comprising a frequency difference having sign information based upon a count generated in said oscillator clock domain.

7. The method of claim 6 wherein said step of generating an error signal comprises a step of generating a two's complement signal based upon said difference between said oscillator count and said predetermined count having said value of N.

8. The method of claim 7 further comprising a step of loading said predetermined count having said value of N into said counter in said oscillator clock domain using said sample signal.

9. The method of claim 8 further comprising a step of generating a difference between a reference clock signal and an oscillator clock signal based upon incrementing a difference between said oscillator clock signal and said predetermined count having said value of N when receiving said sample signal.

10. The method of claim 9 further comprising a step of enabling an output register using said sample signal.

11. The method of claim 6 wherein said step of determining a value of N based upon a bitwidth of a counter used in an oscillator clock domain comprises a step of determining N such that N equals $2^{bitwidth-1}$.

12. A circuit for sampling a frequency difference in an integrated circuit, said circuit comprising:
a first counter coupled to receive pulses of a reference clock signal;
a synchronizer coupled to said first counter, said synchronizer generating a sample signal in said second clock domain when a count of said first counter is equal to a predetermined value N;
a second counter coupled to receive said sample signal and said predetermined value N, said second counter generating a count associated with an oscillator clock signal in said second clock domain, wherein said predetermined value N is based upon a bitwidth of said second counter; and
a latch coupled to latch said count generated by said second counter in response to said sample signal.

13. The circuit of claim 12 further comprising a comparator coupled to receive an output of said first counter and said predetermined value N.

14. The circuit of claim 12 wherein said count generated by said second counter is based on said oscillator clock signal.

15. The circuit of claim 12 wherein said first counter is clocked using said reference clock signal and said second counter and said latch are clocked using said oscillator clock signal.

16. The circuit of claim 12 wherein said predetermined value N is based upon said bitwidth of said second counter such that N equals $2^{bitwidth-1}$.

* * * * *